(12) United States Patent
Windisch et al.

(10) Patent No.: US 9,653,436 B2
(45) Date of Patent: May 16, 2017

(54) LED MODULE WITH LED CHIPS

(71) Applicant: OSRAM GmbH, Munich (DE)

(72) Inventors: Reiner Windisch, Pettendorf (DE); Krister Bergenek, Regensburg (DE); Andreas Biebersdorf, Regensburg (DE); Ralph Wirth, Lappersdorf (DE)

(73) Assignee: OSRAM GMBH, Munich (DE)

(*) Notice: Subject to any disclaimer, the term of this patent is extended or adjusted under 35 U.S.C. 154(b) by 0 days.

(21) Appl. No.: 14/899,163

(22) PCT Filed: Jun. 12, 2014

(86) PCT No.: PCT/EP2014/062257
§ 371 (c)(1),
(2) Date: Dec. 17, 2015

(87) PCT Pub. No.: WO2014/202461
PCT Pub. Date: Dec. 24, 2014

(65) Prior Publication Data
US 2016/0133612 A1    May 12, 2016

(30) Foreign Application Priority Data
Jun. 19, 2013 (DE) .................. 10 2013 211 525

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/504* (2013.01); *F21Y 2113/13* (2016.08);
(Continued)

(58) Field of Classification Search
None
See application file for complete search history.

(56) References Cited

U.S. PATENT DOCUMENTS 9,159,885 B2 * 10/2015 Ouderkirk ........... H01L 25/0753
2007/0008722 A1    1/2007 Fujino et al.
(Continued)

FOREIGN PATENT DOCUMENTS

DE       102008057140 A1    5/2010

OTHER PUBLICATIONS

International Search Report based on Application No. PCT/EP2014/062257 (3 pages and 2 pages of English translation) dated on Sep. 15, 2014 (Reference Purpose Only).
(Continued)

*Primary Examiner* — Lex Malsawma
(74) *Attorney, Agent, or Firm* — Viering, Jentschura & Partner mbB

(57) ABSTRACT

Various embodiments may relate to an LED module, including a number of first inherently unpackaged LED chips, which are in each case designed to emit light of a first color at a respective light emission area, and a number of second inherently unpackaged LED chips, which are in each case designed to emit light of a second color, different than the first color, at a respective light emission area. The LED chips are provided jointly in a housing, and the respective light emission area of a second LED chip is at least 25% smaller than the respective light emission area of a first LED chip. The sum of the light emission areas of the first LED chips is at least 50% greater than the sum of the light emission areas of the second LED chips.

15 Claims, 8 Drawing Sheets

(51) Int. Cl.
  *F21Y 115/10*  (2016.01)
  *F21Y 113/13*  (2016.01)
  *F21Y 113/17*  (2016.01)

(52) U.S. Cl.
  CPC ........ *F21Y 2113/17* (2016.08); *F21Y 2115/10* (2016.08); *H01L 33/507* (2013.01); *H01L 2224/05554* (2013.01); *H01L 2224/48137* (2013.01); *H01L 2924/0002* (2013.01)

(56) References Cited

U.S. PATENT DOCUMENTS

| | | |
|---|---|---|
| 2008/0062682 A1 | 3/2008 | Hoelen et al. |
| 2011/0233565 A1 | 9/2011 | Bierhuizen |
| 2011/0272713 A1 | 11/2011 | Wirth |
| 2011/0305021 A1 | 12/2011 | Xin |
| 2012/0012867 A1 | 1/2012 | Shen et al. |

OTHER PUBLICATIONS

German Search Report based on Application No. 10 2013 211 525.3 (5 Pages) dated on Dec. 11,2013 (Reference Purpose Only).

* cited by examiner

LED MODULE WITH LED CHIPS

RELATED APPLICATIONS

The present application is a national stage entry according to 35 U.S.C. §371 of PCT application No.: PCT/EP2014/062257 filed on Jun. 12, 2014, which claims priority from German application No.: 10 2013 211 525.3 filed on Jun. 19, 2013, and is incorporated herein by reference in its entirety.

TECHNICAL FIELD

Various embodiments relate to an LED module including a number of first LED chips and a number of second LED chips.

BACKGROUND

In comparison with conventional incandescent or fluorescent lamps, optoelectronic light sources currently being developed can be distinguished by an improved energy efficiency, for example. In the context of this disclosure, the term "LED" relates generally to a radiation-emitting optoelectronic component composed of, for instance, a semiconducting material, e.g. to an organic or preferably inorganic light-emitting diode. One challenge in the design of an illuminant including a plurality of LEDs, a so-called LED module, besides e.g. the setting of a specific color locus, may also consist, for example, in achieving a specific luminance distribution, that is to say in optimizing the angle and area distribution of the emitted light.

SUMMARY

According to the present disclosure, this problem is solved by an LED module including a number of first inherently unpackaged LED chips, which are in each case designed to emit light of a first color at a respective light emission area, and a number of second inherently unpackaged LED chips, which are in each case designed to emit light of a second color, different than the first color, at a respective light emission area (also referred to just as "emission area") wherein the LED chips are provided jointly in a housing, and the respective light emission area of a second LED chip is at least 25% smaller than the respective light emission area of a first LED chip, wherein the sum of the light emission areas (the "aggregate emission area") of the first LED chips is at least 50% greater than the sum of the light emission areas of the second LED chips.

In an LED module according to the present disclosure, therefore, at least first and second LED chips are provided, to be precise in each case in a number (in each case at least two, usually significantly more); here the first LED chips emit light of a first color and the second LED chips emit light of a second color during the operation of the LED module. The light emitted overall by the LED module is a mixed light having a corresponding mixed color, said mixed light resulting from the mixing of the light respectively emitted by the individual LED chips.

Specifically, therefore, by way of example, the first LED chips can emit green or red light and the second LED chips can emit blue light and the mixed light in this case can acquire a turquoise or violet mixed color, for example. This is merely intended to illustrate the generality of the concept of the present disclosure explained in detail below; however, one preferred application concerns white mixed light.

The present disclosure, then, therefore relates to such an LED module, to be precise especially the dimensioning of the respective light emission areas of the second LED chips or, which amounts to the same thing in the case of an unchanged aggregate emission area of the second LED chips, an adaptation of the number of second LED chips. To put it simply, unlike conventional practice, first and second LED chips of the same size are not integrated into the LED module, but instead second LED chips that are smaller in relation are provided in order to obtain and to be able to arrange a correspondingly larger number of second LED chips.

This can afford advantages for example in so far as a larger number of second LED chips (in comparison with the reference case with first and second LED chips of the same size) can be distributed more uniformly over an arrangement area. The larger number of second LED chips results in more degrees of freedom in the distribution; accordingly, the light of the second color can be distributed more uniformly over the arrangement area and the intermixing with the light of the other color(s) can be improved.

The "size reduction" according to the present disclosure of the second LEDs in comparison with the first LEDs is of interest in the case of different aggregate emission areas, specifically if the aggregate emission area of the first LED chips is larger than the aggregate emission area of the second LED chips by at least 50%, with increasing preference in this order at least 100%, 150%, 200%, 250%, 300%, 350%, 400%, 450% or 500%. Therefore, if the first and second LED chips were provided with their size being the same, as is conventional practice, the number of first LED chips would be greater than the number of second chips by a multiple, for example even 5 or 10 times.

One reason why the aggregate emission area of the first LED chips can differ from that of the second LED chips even in the case of white mixed light may reside in a different efficiency of LED chips of different colors. If, by way of example, InGaN LEDs are provided as second LED chips of blue color and InGaN LEDs having a green phosphor are provided as first LED chips of green color, the aggregate emission area of the first green LED chips that is necessary for setting the white mixed light (together with third LEDs of red color) may be larger than the aggregate emission area of the InGaN LEDs. Specifically, in many cases the color locus of the green LED chips may be closer to the desired color locus of the mixed light than, for example, the color locus of the blue LED chips. To put it simply, more green light therefore has to be admixed.

This example of the InGaN LEDs provided with green phosphor furthermore illustrates that, in so far as reference is made to the "color of the light emitted at a light emission area" in the context of this disclosure, this need not necessarily concern the light originally emitted by the epitaxial layers; however, the color indication can for example also refer (if provided) to the light emitted by a phosphor layer applied to the respective LED chip. Therefore, an opposite side of the phosphor layer relative to the LED chip is then the "emission area", and the phosphor layer is in this respect part of the respective LED chip; in this case, the light can be conversion light emitted solely by the phosphor (full conversion) or a mixture thereof with, for instance, light emitted originally by the epitaxial layers (partial conversion).

For the sake of simplicity, instead of "light of a color" or the mixing thereof, also just the color of the LED chip or the mixed color of the LED module will be indicated or, for further simplification, reference will also be made just to a "red", "green" or "blue" LED chip.

On account of the different aggregate emission areas, although in any case a large number of first chips could be arranged on an arrangement area, "alternating" neighborhoods could be achieved only to a minimal extent on account of the only very small number of second LED chips (for instance also only a single first LED chip, cf. the first exemplary embodiment). Primarily first LED chips (on account of the large number thereof) would be grouped adjacent to one another and for example around the single second LED chip. As a result, light of the second color would be emitted by at most very few area regions of the arrangement area and a correspondingly highly scattering diffusing means must therefore be provided downstream of the LEDs for the purpose of intermixing the light, but this can increase the light loss and thus reduce the efficiency.

By contrast, the provision according to the present disclosure of a correspondingly larger number of smaller second LED chips makes it possible to improve the intermixing and for instance to provide a weaker diffusing means, which is thus less prone to losses, or to achieve sufficient intermixing even entirely without diffusing means, which increases the energy efficiency of the module.

The light emission area of a second LED chip is therefore smaller than the light emission area of one of the first LED chips by at least 25%, with increasing preference in this order at least 35%, 45%, 55%, 65%, 75%, 85% or 95%. This relationship is fulfilled for at least two of the second LED chips, namely for the at least two LED chips which resulted from the conceptual "division" of a larger LED chip (and were one conceptionally in the reference case); preferably all the second LED chips fulfill the relationship.

Furthermore, the second LED chips fulfill the mutual relationship, on the other hand, in each case with at least one, preferably with each, of the first LED chips. Particularly preferably, the first and the second LED chips here in each case have the same size among one another (and the light emission areas of the first/second LED chips are in each case identical in size among one another).

Therefore, apart from the size difference between first/second LED chips, the size of the emission areas (and thus ultimately the chip size) is varied as little as possible. The reason for this is that LED chips of different sizes can increase the manufacturing outlay, for example during the population of a carrier board that carries the LED chips; this may be the case, for instance, if the LED chips of different sizes cannot be grasped and positioned by the same tool (pick and place). In principle, therefore, it is endeavored in this respect to provide LED chips having as far as possible the same size.

Independently of light intermixing that is improved by the number increase, setting a specific number of LED chips of one color which are operated jointly as a "string" for example in a manner connected in series can also afford advantages with regard to a common driver electronic unit that supplies the LED strings simultaneously. Specifically, the number of LED chips connected in series per string can be set with a size adaptation of the emission areas according to the present disclosure for example in such a way that approximately the same voltage is dropped per string.

In general, however, the number increase according to the present disclosure is, of course, not restricted to this driver concept. The LED chips of one color can also be interconnected in parallel, for example; by a number adaptation of the LED chips interconnected in parallel on a string, it is thus possible to achieve, for example, approximately identical currents for the individual strings. A driver electronic unit can accordingly supply the individual strings with approximately the same current, and the light color can then be set for example by pulse width modulation.

Against the background of the abovementioned "voltage adaptation", for instance, the present disclosure in this respect, independently of the features of the main claim, also relates to an LED module including a number of first inherently unpackaged LED chips, which are in each case designed to emit light of a first color at a respective light emission area, and a number of second inherently unpackaged LED chips, which are in each case designed to emit light of a second color, different than the first color, at a respective light emission area, wherein the LED chips are provided jointly in a housing, and the respective light emission area of a second LED chip is at least 25% smaller than the respective light emission area of a first LED chip. The provision of LED chips adapted in terms of their respective emission area is therefore expressly intended also to be disclosed independently of the ratio of the aggregate emission areas of the first and second LED chips because the aggregate emission area at least approximately does not alter the voltage dropped across a string.

The other features disclosed in the context of this application, for instance the preferred interval limits regarding the size ratio of the emission areas, the indications of how many LED chips fulfill the mutual relationship, or the preferred spatial arrangement possibilities, are however expressly intended also to apply to the embodiment (independent of the aggregate emission areas) having different sizes of the respective emission areas, as mentioned in the previous paragraph. Staying with the terminology of the preceding paragraph, for example, the second LED chips can then be red LED chips and the first LED chips can then be green LED chips (and in this respect the disclosure given with regard to the constitution of the red/green LEDs is intended also to be disclosed in this context).

Generally, the LED chips packaged jointly in the LED module according to the present disclosure are inherently unpackaged, that is to say that, for example, they are not previously placed individually in each case into a dedicated housing and in each case individually encapsulated with silicone, for example; instead, the LED chips are packaged jointly, that is to say, for example, placed onto a common carrier board, electrically connected and then enveloped with an enclosing material, that is to say filled in, for example, using e.g. silicone. The "filling in" can also be carried out by printing or spraying, for example, filling in by molding (with pressure or without pressure) being particularly preferred. The LED chips, with regard to the main emission direction, are preferably covered by an integral (monolithic) enclosing material which particularly preferably touches the emission areas and, if appropriate, also (regions of the) side surfaces of the LED chips.

The carrier board can provide conductor tracks to or via which the LED chips are electrically conductively connected, for instance by bonding and/or soldering connections. The indication "inherently unpackaged" therefore relates to the LED chip after front end manufacture, which LED chip is processed (packaged) not individually but rather jointly with the other LED chips of the LED module in the context of back end manufacture. In an LED module according to the present disclosure, packaged LEDs are thus not installed as "finished components", which would be the usual route during production of the module because already packaged LEDs are protected and can be integrated into the module just by soldering connection. By contrast, the present approach of installing unpackaged LED chips requires additional knowledge in the field of back end manufacture, which a module manufacturer generally does not have.

It goes without saying, however, that the indication "unpackaged" is not intended to exclude the presence of a layer sequence applied e.g. to the epitaxial layers in the context of front end processing; it goes without saying that metallization and/or passivation layers are therefore usually provided on the LED chips.

Preferably, in the case of an LED module according to the present disclosure, a region of the arrangement area between at least two of the LED chips, particularly preferably between all the LED chips, is provided as a region of "high reflectivity"; the region is therefore intended to have a reflectivity of, with increasing preference in this order, at least 50%, 60%, 70%, 80%, 85% or 90% (relative to the visible range of the spectrum).

A corresponding reflectivity can be set, for example, by an Ag and/or Al mirror that is applied to the arrangement surface or forms the latter. Furthermore, for example, a matrix material with embedded particles that is provided between the LED chips can also cause the reflectivity, for instance a silicone material, for example with embedded titanium dioxide particles.

The matrix material or generally a coating of the arrangement area that provides the reflectivity is intended to project beyond the LED chips preferably by not more than 25%, 15% or 5% (relative to the height—taken in the main propagation direction—of the LED chip having the smallest height); particularly preferably, it does not project beyond the LED chips at all.

Preferably, the LED chips (independently of the provision of a reflective region therebetween) are rather "close-packed" on the arrangement area; therefore, the minimum distance between two nearest neighboring LED chips is then intended to be, with increasing preference in this order, not more than 5 mm, 4 mm, 3 mm, 2 mm or 1 mm (from edge to edge). This holds true, in each case in pairs for nearest neighbors, for preferably at least 25%, 50%, 75%, 95% of the LED chips or of all of the LED chips.

In so far as reference is made to propagation or intermixing of light in the context of this disclosure, this is, of course, not intended to imply that corresponding propagation or intermixing of light must actually be effected in order to fulfill the subject matter, rather a description is merely given of a module designed therefor.

Further preferred configurations are found in the dependent claims and in the description below; furthermore, this should not be interpreted in any specific way among the different categories and the disclosure should in any case be taken as being implicit with regard to an LED module and the production and/or use thereof.

An LED module including LED chips of two colors has primarily been discussed hitherto; by a corresponding selection of two colors, a specific color locus can be achieved statically for the mixed light.

However, in order to be able to realize a color-locus-controllable LED module, that is to say an LED module for whose mixed light the color locus can be set by different energization of the different-colored LED chips, a further third color is required. As will be explained in detail in the context of the exemplary embodiments, with three colors, the proportions of which in the mixed light can vary, it is possible for example to produce a white light source whose color locus can be varied along the Planckian locus. It is therefore possible, by the energization, optionally to set e.g. warm white light (color temperature <3300 K); neutral white light (color temperature of 3300 K to 5300 K) and daylight white light (color temperature >5300 K) (the present disclosure is also directed in particular to such a use).

Therefore, the present disclosure also relates in particular to an LED module including (besides first and second LED chips) third LED chips, which emit light of a third color at a respective light emission area; the third color differs from the first and second colors. Generally, "mutually differing colors" have a different color locus, preferably color loci separated by at least 0.05, with further preference at least 0.1, in terms of absolute value in the CIE standard chromaticity diagram.

The respective light emission area of a third LED chip is preferably larger than the respective light emission area of a second LED chip (this preferably holds true for all third LED chips, particularly preferably alternately with all second LED chips); in this respect, "larger" means larger than the correspondingly smaller light emission area of the second LED chip, for example, with increasing preference in this order, by at least 10%, 20%, 30%, 40%, 50%, 60%, 70%, 80% or 90%.

In one preferred embodiment, a respective light emission area of a third LED chip (preferably of each third LED chip) is at the same time smaller than the respective light emission area of a first (preferably of each first) LED chip, to be precise by at least 10%, with increasing preference in this order at least 15%, 20%, 25%, 30%, 35%, 40% or 45%. In this configuration, therefore, the light emission area of a third LED chip can be approximately half the size of the light emission area of a first LED chip and approximately double the size of the light emission area of a second LED chip.

This embodiment with "graduated" light emission areas of the first, second and third LED chips may be of interest (and disclosed explicitly with regard to a corresponding use) particularly if the first, second and third LED chips are supplied by a common driver. In this case, the LED chips can be provided in a manner divided among three strings, for example, that is to say the first, second and third LED chips in each case jointly on a string (e.g. in general fourth LED chips can also be provided; a fourth or further string is also possible, of course).

The strings can be supplied by the driver in parallel, that is to say simultaneously; for instance in the case of LED chips connected in series per string, it may be advantageous here if approximately the same voltage is dropped per string, that is to say that the respective voltage of each string differs by not more than 10% or 5% from a mean voltage (a mean value of the voltages dropped across the individual strings). This is because larger voltage differences can otherwise result in an increased power loss.

A corresponding size adaptation of the third LED chips makes it possible to achieve the desired uniform distribution of the voltage dropped across the individual strings for the case where the first and second LED chips are operated with the same forward voltage in each case, but that of the third LED chips is smaller. One example of this is InGaN LEDs, whose originally blue light is utilized directly in the case of second LED chips and which, provided with a respective phosphor element, as first LED chips, provide green light; in this case, the third red LED chips can be InGaAlP LEDs, for example, whose forward voltage with a value of approximately 2 volts is smaller than that of the InGaN LEDs with a value of approximately 3 volts.

In order that the voltage dropped across the string having the third red LED chips corresponds approximately to the voltage dropped across the other strings, a number of third red LED chips that is greater by approximately half must be provided in a manner connected in series. However, since red light is required in a proportion not of corresponding magnitude, the respective emission areas of the third LED chips are reduced in size in the manner described above, which in principle does not alter the voltage dropped across the string (the voltage dropped across an LED chip is at least approximately independent of the size thereof).

In another preferred embodiment, the respective emission area of a third LED chip, preferably of each third LED chip, is provided such that it is substantially of the same size as the respective light emission area of a first LED chip, preferably of each first LED chip. In this case, therefore, the emission areas deviate from one another by not more than 7.5%, 5% or 2.5%, as a result of which the manufacturing advantages mentioned above for the case of LED chips having the same size can be achieved.

The "number increase" by "emission area size reduction" according to the present disclosure is therefore implemented only if actually necessary; this is because, besides the mentioned advantages of LED chips having the same size, it is also endeavored, in principle, not to provide LED chips having an excessively small size. This is because, apart from the increased wiring outlay, an excessively finely structured subdivision would also increase the area-related LED chip costs (the price per unit emission area) because along the edges of an LED chip a certain region usually remains unused in terms of lighting technology (sawing frame) and the lighting-technological area utilization is therefore better in the case of larger LED chips.

The sum of the light emission areas of the third LED chips is preferably at least 50% greater than the sum of the emission areas of the second LED chips (the preferred interval limits disclosed for the first LED chips are intended to be disclosed for the second LED chips as well); the aggregate emission area of the second LED chips, the respective emission area of which is reduced in size according to the present disclosure in order to increase the number, is therefore smaller than the aggregate emission area of the first LED chips and preferably also smaller than that of the third LED chips.

Specifically, the inventors have established that in the case of an LED module including LED chips of three colors for setting white mixed light, for example, usually only the area proportion of one of the three colors is significantly smaller (cf. FIG. 4A and the associated description); the "area proportion" is the proportion constituted by the respective aggregate emission area in the sum of all the emission areas, the "total emission area". Therefore, a "number increase" according to the present disclosure should also be implemented only for this color.

In a preferred configuration, the first color is a green hue, the second color is a blue hue and the third color preferably provided is a red hue. In this case, respectively within an interval of, with increasing preference in this order, (+/−0.2), (+/−0.1) or (+/−0.05), "green hue" means a color value in the CIE standard colorimetric system around an X-value of 0.15 and a Y-value of 0.06 and "red hue" means a color value around an X-value of 0.65 and a Y-value of 0.33.

The "blue hue" can be a "traditional" blue hue in a corresponding interval around an X-value of 0.15 and a Y-value of 0.06; on the other hand, bluish white in an interval around an X-value of 0.22 and a Y-value of 0.25 can also be provided as the blue hue. In a color-locus-controllable LED module, a bluish white hue may be preferred for example on account of a reduced dependence of the color rendering index on the color temperature set; specifically, in the case of a traditional blue hue, the color rendering index can decrease greatly at high color temperatures, which may be disadvantageous depending on the lighting purpose (see FIGS. 4B and 5 and the associated description).

The exemplary embodiments illustrate that although the area proportion of the LED chips can be greater in the case of a bluish white hue (cf. FIGS. 6A and 6B in comparison with FIG. 4A with the associated explanations), it is still significantly less than that of the LED chips with a green hue at any rate at color temperatures of less than 4000 K, which are solely or primarily of interest in many applications.

In one preferred development of the LED module including first green LED chips and second blue LED chips, the number of blue LED chips is increased by the emission area size reduction according to the present disclosure in such a way that the number of green LED chips is not more than 4 times greater, with further preference not more than 3 or 2 times greater. The blue total emission area is therefore divided among so many LED chips of smaller size that the number thereof is approximated to that of the green LED chips and intermixing is thus simplified.

Further preferred configurations concern the arrangement of the second, for example blue, LED chips, the number of which is increased according to the present disclosure. Specifically, the arrangement is preferably effected in such a way that second LED chips have a respective distance with respect to a light emission area centroid and said respective distances deviate by not more than 10%, preferably not more than 5%, from a mean distance formed as a mean value of said respective distances.

This distance condition expressly need not be satisfied by all the second LED chips, rather for example only at least 2, 3, 4, 5 or 6 second LEDs can also fulfill the condition as a subgroup of the number of second LED chips. In this case, a plurality of such subgroups each per se fulfilling the distance condition can also be provided, cf. the embodiment in accordance with FIG. 3. In the case of a plurality of subgroups, the mean distances between respective nearest neighboring subgroups can then differ for example by at least 50%, 75% or 100% (relative to the respective smaller mean distance).

The "light emission area centroid" referred to above is formed as the area centroid of the emission areas of all the LED chips of the LED module, to be precise taking into account the distances between the emission areas. Therefore, when determining the emission area centroid, the distance between two emission areas contributes no "mass", but causes a shift in the emission area centroid, in a manner similar to a lever effect. In the preferred case of a symmetrical construction, the emission area centroid arises as a point of symmetry, for instance from a rotation axis in the case of a rotational symmetry, or as a point of intersection of two axes of symmetry with respect to which the arrangement of the LED chips is mirror-symmetrical in each case.

In one preferred development, the LED chips of a subgroup (there can also be just a single subgroup) are then arranged substantially equidistantly with respect to a circumferential direction around the emission area centroid. Nearest neighbors in relation to the circumferential direction therefore have, in each case with the emission area centroid as vertex, an angular distance that deviates by not more than 10%, preferably not more than 5%, from a mean angular distance formed as a mean value of the respective angular distances.

In so far as reference is made generally to the distance/angular distance of LED chips, this relates in detail to the distance/angular distance between the area centroids of the emission areas of the LED chips respectively considered.

One preferred embodiment relates to an LED module wherein a first light emission area centroid (formed as an area centroid of the emission areas of all first LED chips taking account of the distances between the respective emission areas thereof), and a second light emission area centroid (which is formed correspondingly) are substantially congruent, and/or wherein the mean distance between the first LED chips and the first emission area centroid substantially corresponds to the mean distance between the second LED chips and the second emission area centroid.

In so far as third (or further) LED chips are provided, preferably their third/further emission area centroid is also congruent with the first and second emission area centroids. Alternatively or preferably in combination therewith, furthermore, the mean distance between the third/further LED chips and the third/further emission area centroid can also substantially correspond to the mean distances between the first and second LED chips and their respective emission area centroids.

Generally, a first, second (or third/further) emission area centroid is formed in a manner described above for the global emission area centroid (the latter is meant in so far as "emission area centroid" without addition of "first, . . . " is addressed). In the following paragraphs, for the sake of clarity, reference is made only to the first and second emission area centroids; however, the same indications are intended explicitly also to be disclosed for a third and any further emission area centroid.

The first and second emission area centroids are preferably "substantially congruent", that is to say that a connecting line connecting the two is intended to have a length of preferably not more than 10%, 5%, 2.5% or 1% of the extent—taken in the direction of the connecting line—of the light emission area arrangement of the LED module, that is to say of the luminous region of the LED module. Furthermore, the mean distances between the first and second LED chips (respectively all thereof) and the respective first and second emission area centroids are intended to be of substantially the same magnitude, that is to say preferably deviate by not more than 10%, preferably not more than 5%, from a total mean value formed as a mean value of the mean distances.

As already mentioned in the introduction, the light emitted by a respective LED chip is not necessarily (solely) the light emitted by, for example, the epitaxial layers thereof. One preferred configuration concerns an LED module wherein on the LED chips of the number of first LED chips provision is made in each case of a phosphor layer solely covering the respective LED chip; the respective phosphor layer then forms the light emission area of the corresponding LED chip.

Such phosphor layers arranged in a chipwise manner, in a preferred configuration, are provided (at least) for the first LED chips, that is to say those LED chips whose area proportion is the greatest; the logical order is reversed, however: since the color locus of the LED chips having a respective phosphor layer is in many cases closest to the desired color locus of the mixed light and accordingly a large amount of light of these LED chips has to be admixed, the area proportion thereof is greater.

In general, the green hue is provided by phosphor layers arranged in a chipwise manner, for instance by conversion of originally blue light. LED chips originally designed for emitting blue light can therefore be provided as green LED chips after having been provided with a green phosphor layer, and as blue LED chips without a phosphor layer. A corresponding originally blue LED chip can be an InGaN LED, for example, which as green LED chip is coated with YAG:Ce, for example.

A phosphor layer provided in a chipwise manner can also be provided on the respective LED chip as early as before the latter is incorporated into the module; on the other hand, the LED chips can e.g. also be arranged without a respective phosphor layer on a carrier board and be provided with the phosphor layer, for instance, only prior to potting with an enclosing material.

One preferred embodiment, which moreover is also regarded as an present disclosure independently of the features of the main claim (independently of the size reduction of the respective light emission areas of the first LED chip) and is intended to be disclosed in this form, concerns a phosphor element disposed downstream of all the LED chips "globally", preferably in combination with individual phosphor layers provided on a portion of the LED chips ("local" phosphor layers).

In this respect, a special feature of the global phosphor element consists in the fact that it is also provided downstream of those LED chips whose light is not intended to be converted at all; this can afford advantages with regard to production, for example, because then not every second LED chip (whose light is intended to be converted) need be provided with a phosphor layer in each case individually as described above. Work steps can be saved or simplified, for example; this can more than compensate for any disadvantage for example, for instance certain losses in the luminous efficiency (even if the light emitted by the first/third LED chips is not converted by the phosphor element, a certain scattering can take place).

Generally, the intention is not to rule out the situation where the light emitted by the first LED chips (or third LED chips if provided) is also influenced by the phosphor element in terms of its spectral properties; the phosphor element converts the light of the second LED chips just primarily, not necessarily exclusively. The phosphor element, in particular a bluish white phosphor element therefore converts for example at least 30%, preferably at least 40% and with further preference at least 50%, of the light of the second LED chips, that is to say preferably of the blue LED chips; on the other hand, the phosphor element, in particular a bluish white phosphor element, converts for example at most 15%, preferably at most 10%, of the light of the first LED chips, that is to say in particular green LED chips.

In one preferred embodiment, the global phosphor element is provided in conjunction with second LED chips whose respective area is reduced in size according to the present disclosure, that is to say that said global phosphor element serves for converting the light emitted by these relatively small LED chips. The light emission area of a small LED chip can even be approximately only ¼ of that of the remaining large LED chips, for example 0.25 mm$^2$ compared with 1 mm$^2$, and it is particularly advantageous for a manufacturing standpoint not to have to coat the small first LED chips individually in each case.

In a preferred configuration, an emission area size reduction according to the present disclosure concerns blue LED chips; the particularly preferred bluish white hue thereof is with further preference—on account of the small area of the blue LED chips—set with a global phosphor element. Therefore, for example, the blue light emitted by small InGaN LEDs can be partly converted by a short-wave garnet phosphor, for instance LuAGaG, or a (nitrido-)orthosilicate phosphor, exactly to bluish white; in this case, the phosphor is provided as a global phosphor element.

The advantages of this embodiment are thus, firstly, the good color rendering properties, even at high color temperatures, and secondly, the good producibility on account of the global phosphor element, even with regard to mass production. The global phosphor element is then illuminated comparatively uniformly by second LED chips increased in the number thereof according to the present disclosure, and the conversion light is emitted correspondingly uniformly. Particularly preferably, an additional scattering means can then also be dispensed with.

In one preferred configuration of the phosphor element, the latter is provided as matrix material with phosphor particles embedded therein; said matrix material envelops all LED chips of the module. The phosphor particles can therefore be introduced into a silicone material, for example, and the LED chips can be encapsulated therewith. Generally, the "enveloping" by the matrix material relates at least to a covering of the top sides of the LED chips, preferably also to a covering of the side surfaces thereof; the rear side of the LED chips is generally mounted on a carrier board.

Generally, it should be noted that "emission area" in the context of this disclosure should not necessarily be understood as exclusive emission area, rather the LED chip can also emit light at other areas, for example the side surfaces. Furthermore, the term should also be understood to the effect that the light emission takes place at the light emission area in any case on account of the housing in the LED module; the LED chip can therefore be provided for example per se actually for light emission at the underside, by which it is mounted on the carrier board, and the light emission toward the top at the emission area can take place only owing to reflection at the carrier board (flip chip mounting).

In a further preferred embodiment of the global phosphor element, all the LED chips of the module are enveloped with an enveloping body and the phosphor element is applied to said enveloping body in layer form. In general, the enveloping body can in this case also be, for example, an above-described matrix material with phosphor particles embedded therein, that is to say that the global phosphor element in layer form can be combined with a phosphor element described above; preferably, however, no phosphor is embedded in the enveloping body and the phosphor element in layer form is provided as sole global phosphor element.

Generally, "downstream of all the LED chips" should preferably be understood such that at least the light emitted by each individual LED chip along a respective main propagation direction, which is formed per LED chip as a mean value of the emission directions weighted according to the power, is incident on the phosphor element; particularly preferably, the entire light emitted by the LED chips is incident on the global phosphor element.

The global phosphor element "in layer form" just described has, in an area direction that is transverse, preferably perpendicular, with respect to the main emission directions of the LED chips, an extent that is larger by a multiple, for example at least 5, 10 or 15 times larger, compared with perpendicular thereto (in a height direction in which the main emission directions are usually oriented).

A further preferred embodiment concerns a phosphor element spaced apart from the LED chips of the module by an air-filled interspace; in this case, the LED chips are preferably enveloped with an enveloping body, for example a silicone material, and the air-filled interspace lies between the latter and the phosphor element. Relative to a distance between respective emission area and phosphor element, said distance being taken in each case along the main emission direction and being averaged over all the LED chips, the air-filled interspace extends (likewise averaged over all the LED chips) preferably over at least 10%, with further preference at least 20%, 30%, 40% or 50%, of said distance.

Since, in the case of the partial conversion to bluish white that is preferred for the global phosphor element, the degree of conversion can be comparatively small, the arrangement of the phosphor element in a manner spaced apart by an air gap is possible particularly well; this is because the Stokes shift is comparatively small, that is to say that only little power loss is incurred and the phosphor element accordingly need not be attached over a large area for cooling purposes.

The present disclosure also relates to the use of an above-described LED module for setting the color locus of the light emitted in total by the LED module by setting an energization of the first LED chip and of the second LED chips. One particularly preferred use concerns the setting of the color locus by an above-described driver electronic unit jointly supplying the strings in which LED chips of one color are in each case connected in series.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
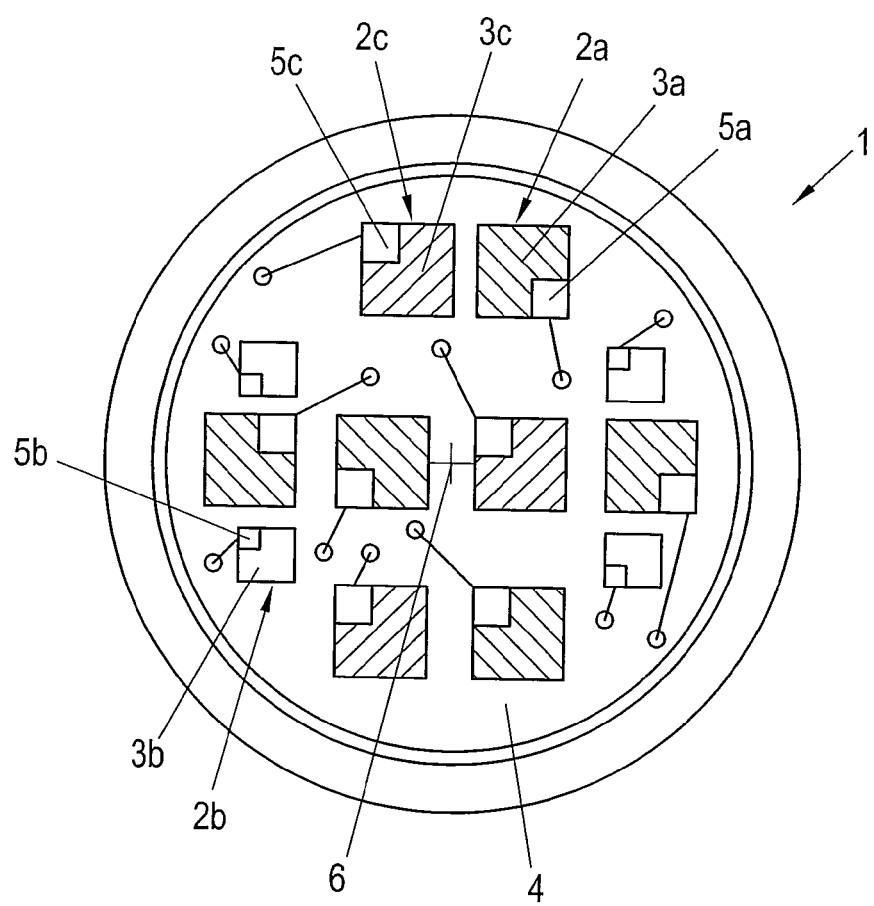
FIG. 1 shows a first LED module including four LED chips which, according to the present disclosure, are reduced in size in terms of their area and thus increased in terms of their number.

FIG. 1 shows a schematically simplified plan view of an LED module 1. In the latter, various LED chips 2a, b, c, which are per se unpackaged in each case, are jointly packaged, that is to say arranged on a carrier board 4 and encapsulated with a silicone material.

First LED chips 2a are designed for emitting light of a green hue, to be precise at their respective emission area 3a. Furthermore, second LED chips 2b are provided for emitting blue light at their respective light emission areas 3b, and the third LED chips 3c emit red light at their respective light emission areas 3c. With regard to the respective position of the color locus of the red, green and blue light, reference is made to FIG. 5.

Alongside the respective emission area 3a, b, c, a respective bonding pad 5a, b, c serving for electrical contacting by a bonding wire is also illustrated per LED chip 2a, b, c in the plan view; the respective second contact per LED chip 2a, b, c is provided on the rear side; the corresponding wiring on the carrier board 4 is not illustrated for the sake of clarity (and the bonding connections are not shown either).

A scattering means (not shown) is provided downstream of the emission areas 3, that is to say subsequently in the direction of light propagation, said scattering means intermixing scattering to a certain extent the light emitted by the LED chips 2, which are arranged in a manner spatially distributed on the arrangement area 4; white mixed light is present downstream of the scattering means.

In order to improve the efficiency of the LED module 1, it is of interest to minimize the scattering. Therefore, the LED chips 2 are arranged in such a way that light mixing already takes place on account of the spatial distribution on the arrangement area 4 downstream of the emission areas 3.

As explained in detail below with reference to FIG. 4A, the area proportion of the blue emission areas 3b is the smallest. Only a single blue LED chip 2b corresponding in terms of its area to that of the green 2a and red LED chips 2c would have to be provided.

According to the present disclosure, however, instead of a single blue LED chip 2b, four blue LED chips are provided, that is to say four LED chips having an area of 0.25 mm² in each case instead of one having an area of 1 mm²; the emission area substantially scales with the chip area. The emission area 3b of a blue LED chip 2b therefore has dimensioning corresponding only to approximately 25% of the emission area 3a, c of one of the other LED chips 2a, c, and more blue LED chips 2b are provided for compensation purposes. The aggregate emission area remains unchanged relative to the reference case with a single larger blue light emission area.

By virtue of the fact, therefore, that a larger number of LED chips 2b specifically reduced in size in terms of their respective emission area 3b are provided, said LED chips can be distributed more uniformly over the arrangement area 4.

The blue LED chips 2b are arranged substantially equidistantly with respect to an emission area centroid 6. For wiring reasons, for instance, it may be necessary here for individual LED chips 2b to be offset a little relative to their theoretically optimum position. However, a respective distance between blue LED chip 2b (the area centroid of the emission area 3b thereof), and the emission area centroid 6 deviates by less than 5% from a mean value that results from averaging over the in this case four respective distances.

Figure 2:
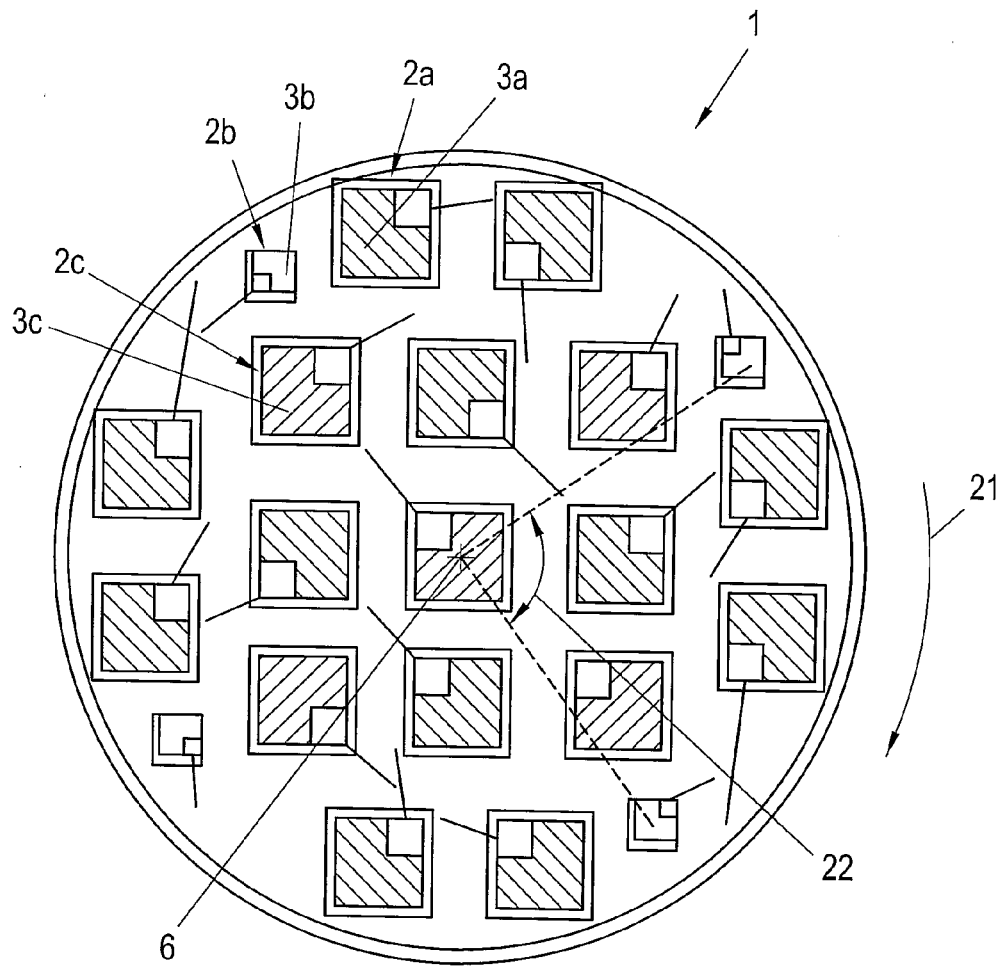
FIG. 2 shows an LED module including equally four LED chips increased in terms of their number according to the present disclosure.

FIG. 2 shows a further LED module 1, in which, however, twelve green LED chips 2a and five red LED chips 2c have been provided, to be precise once again together with four blue LED chips 2b reduced in size in terms of their respective emission area 3b according to the present disclosure. As also in the case of the LED module 1 in FIG. 1, the green LED chips 2a are InGaN LEDs, on each of which a phosphor layer (not shown) is provided which converts the originally blue light to light of a green color. In the case of the red LED chips 2c, the light originally emitted with a red hue by the InGaAlP LEDs provided therefor is used without further conversion.

The blue LED chips 2b increased in terms of their number are once again distributed substantially equidistantly with respect to the emission area centroid 6; furthermore, the blue LED chips 2b are also distributed substantially equidistantly with respect to a circumferential direction 21, that is to say that the angles 22 respectively spanned by two blue LED chips 2b that are adjacent in the circumferential direction 21 in relation to the emission area centroid 6 are substantially of the same magnitude.

Figure 3:
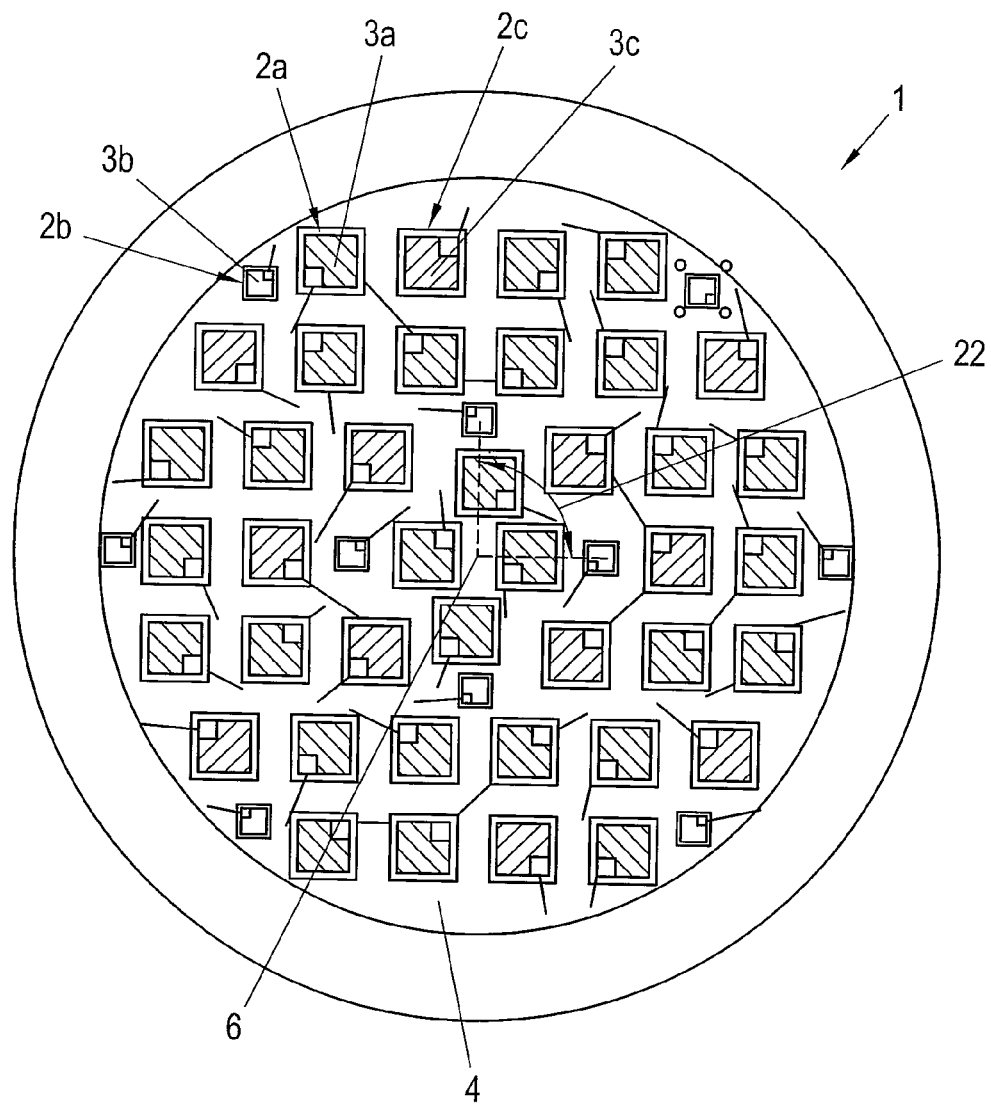
FIG. 3 shows an LED module including ten LED chips increased in terms of their number according to the present disclosure.

FIG. 3 shows a further LED module 1 including in this case 28 green LED chips 2a (InGaN LEDs having a green YAG:Ce phosphor), ten blue LED chips 2b (InGaN LEDs) and twelve red LED chips 2c (InGaAlP LEDs). The blue LED chips 2b are once again provided, according to the present disclosure, with emission area 3b respectively reduced in size and in a correspondingly increased number.

The ten blue LED chips 2b are arranged uniformly on the carrier board 4 in a form such that four inner blue LED chips 2b as first subgroup are arranged substantially equidistantly with respect to the emission area centroid 6; furthermore, the LED chips 2b of said first subgroup are also distributed substantially equidistantly with respect to the circumferential direction 21, that is to say that the angle 22 between neighboring LED chips 2b of said subgroup is in each case approximately 90°.

The remaining six blue LED chips 2b are arranged as second subgroup outside the first subgroup relative to the emission area centroid 6. The mean distance of the outer subgroup is approximately 150% greater than the mean distance of the inner subgroup (relative to the latter). The LED chips 2b of the outer subgroup are also provided substantially equidistantly with respect to the emission area centroid 6.

Overall, a good intermixing of the light of different colors emitted by the green, blue and red LED chips 2a, b, c can be achieved by this arrangement, that is to say that accordingly only a weakly scattering diffusing plate (not shown) need be provided for the LED module 1 or such a diffusing plate can, if appropriate, also be completely dispensed with.

Figure 4A:
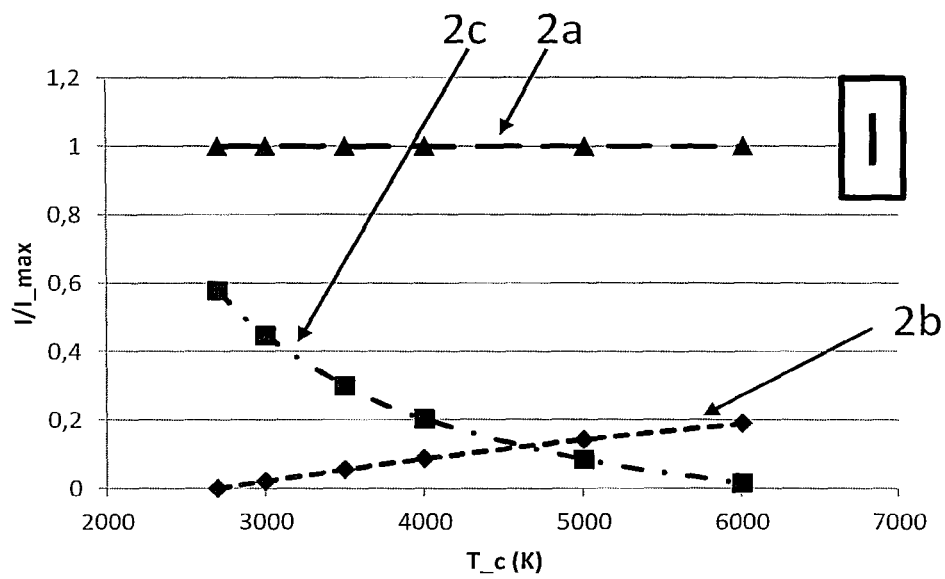
FIG. 4A shows the energization of LED chips for setting a color temperature in the case of a first color triangle.

FIG. 4A shows, for the combination of InGaN LEDs having a phosphor layer as green LED chips 2a, InGaN LEDs as blue LED chips 2b and InGaAlP LEDs as red LED chips 2c, in what ratio (identical aggregate emission areas being assumed) the green, blue and red LED chips 2a, b, c have to be energized in order to set a desired respective color temperature $T_c$ of between 2700 K and 6000 K. The exemplary calculation on which the diagram is based proceeds from a YAG:Ce phosphor as green phosphor and a dominant wavelength of the InGaN LEDs (which are provided with the phosphor in part as green LED chips 2b) of 460 nm and a dominant wavelength of the InGaAlP LEDs of 615 nm and was carried out for an operating temperature of 80° C.

FIG. 4A then illustrates, in a manner normalized to the same maximum operating current $I_{max}$, the operating current to be set in each case, that is to say for the green 2a, blue 2b and red LEDs 2c, in order to achieve the respective color temperature, plotted on the X-axis. By corresponding energization or variation of the energization, the color locus of the LED module 1 can be shifted along the Planckian locus shown in FIGS. 6A and 6B, that is to say that different white hues can be set.

It goes without saying that the LED chips 2a, b, c could theoretically also be provided with identical aggregate emission areas and the color locus could be set solely by the energization; in this case, however, for example, an unnecessarily large aggregate emission area of the blue LED chips 2b would be provided and accordingly unnecessarily high costs would be incurred.

It is evident from FIG. 4A that even in cold white, that is to say at a color temperature of 6000 K, that is to say when the required proportion of blue light is the greatest, the current required for the operation of the blue LED chips 2b amounts approximately only to ⅕ of the current required for the green LED chips 2a. Accordingly, the proportion constituted by the blue emission areas 3b in the total emission area of the LED module can be reduced, that is to say that—LED chips of identical size being assumed—only one blue LED chip 2b has to be provided in relation to five green LED chips 2a; this is realized in principle with the LED module 1 in accordance with FIG. 1, wherein the one blue LED chip 2b is subdivided into four smaller LED chips 2b.

In the case of the embodiment in accordance with FIG. 2, the ratio of green aggregate emission area to blue aggregate emission area is approximately 12:1; accordingly, only color temperatures up to approximately 4000 K can be set well, although this suffices for a large number of applications.

Figure 4B:
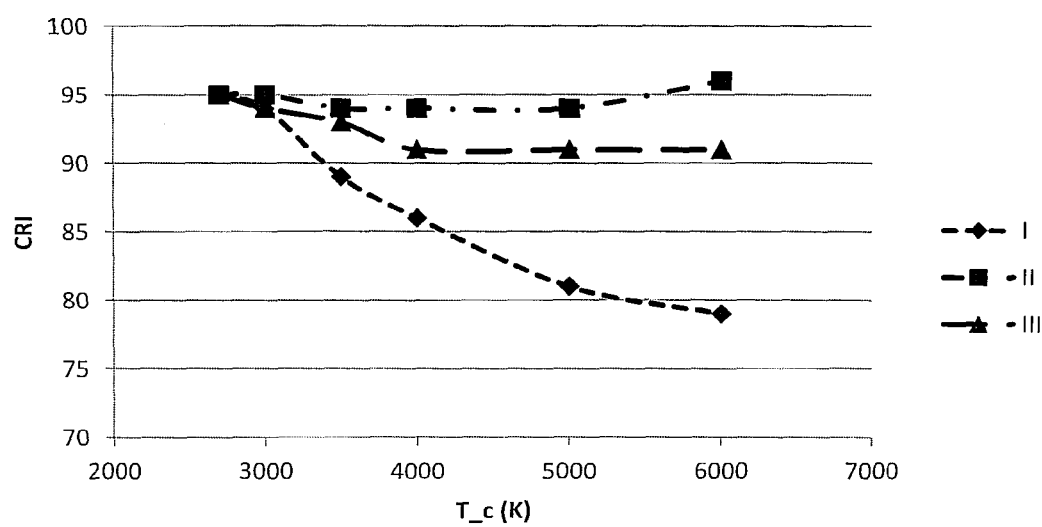
FIG. 4B shows the profile of the color rendering as a function of the color temperature for different color triangles.

FIG. 4B shows for the exemplary embodiment in accordance with FIG. 4A, inter alia, the color rendering index CRI as a function of the color temperature; the lower graph designated by "I" in the diagram in this case represents the LED combination explained in detail with reference to FIG. 4A. One disadvantage thereof is the color rendering index CRI that decreases significantly toward higher color temperatures. To put it simply, therefore, the colors of illuminated objects appear increasingly unnatural if higher color temperatures are set.

If appropriate, a color rendering index of around 90 can be achieved even up to approximately 4000 K by an optimization of the chip wavelength and of the phosphor; however, such a system requires a very narrow tolerance range and is accordingly costly from a manufacturing standpoint.

Figure 5:
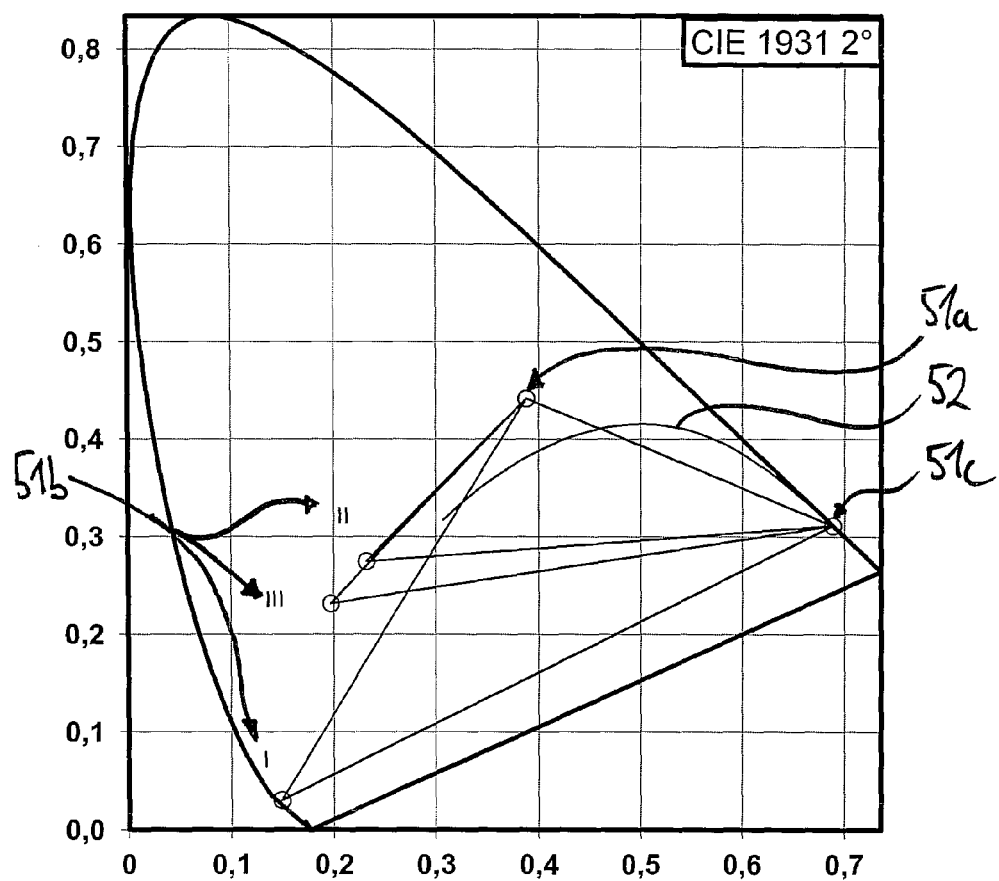
FIG. 5 shows different color triangles in a CIE standard chromaticity diagram.

The reason for this becomes clear with reference to the CIE standard chromaticity diagram illustrated in FIG. 5. In principle, any color locus within the color triangle spanned by the green hue 51a, the blue hue 51b and the red hue 51c can be set by a corresponding energization of the LED chips. In particular, it is thus possible to set the different white values along the Planckian locus 52; in this case, only that region of the Planckian locus which lies within the corresponding color triangle is accessible, for which reason only color temperatures above 2700 K can be set (the connecting line between the green hue 51a and the red hue 51c intersects the Planckian locus 52 at approximately 2700 K).

It can furthermore be discerned in FIG. 5 that, in the case of the blue color locus 51b of variant "I", the Planckian locus 52 lies outside the color triangle even at very high color temperatures. Even at the color temperatures still lying within the color triangle, however, the proportion of red light already becomes vanishingly small toward higher color temperatures, for which reason the spectral composition of the mixed light lacks the red light component and the color rendering is accordingly impaired.

On account of these disadvantages of a blue color locus 51b of variant "I" that is provided solely by the blue light originally emitted by InGaN LEDs, one preferred configuration relates to a bluish white hue 51b of variants "II"/"III". The bluish white hues are shifted in the direction of green hues by a partial conversion of the blue InGaN light, wherein a short-wave garnet phosphor, namely LuAGaG, is provided in the case of variant "II" and a nitridoorthosilicate as green phosphor is provided in the case of variant "III". In both cases, a larger part of the Planckian locus lies within the respective color triangle. Accordingly, at high color temperatures, the Planckian locus 52 is also at a small distance from the connecting line between green 51a and blue color locus 51b; therefore, a certain proportion of red light must also be admixed, which improves the color rendering.

The improved color rendering also becomes clear with reference to the diagram shown in FIG. 4B; in the case of both bluish white variants "II" and "III", the decrease in the color rendering index toward higher color temperatures is significantly smaller.

Figure 6A:
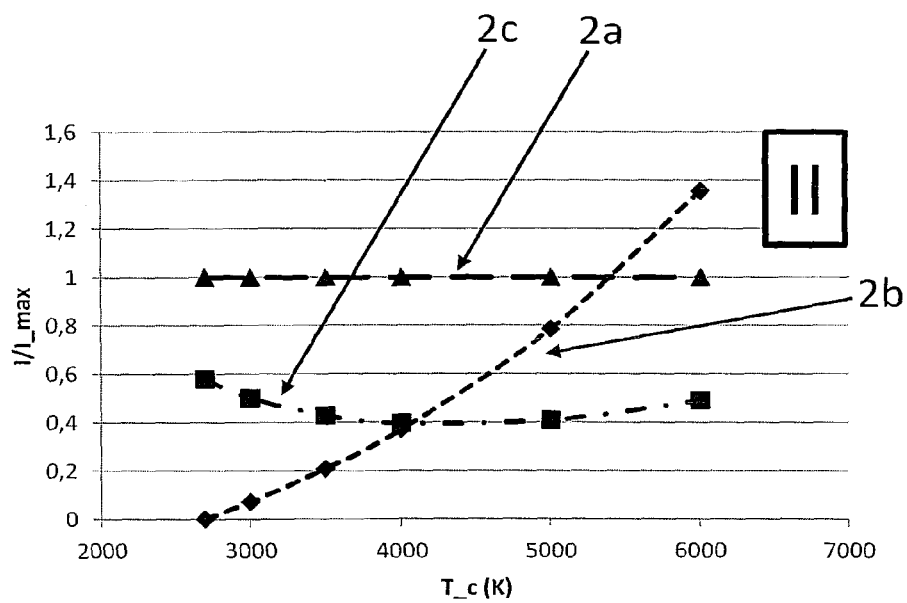
FIGS. 6A and 6B show the currents required for setting a respective color temperature in the case of two further color triangles.
Figure 6B:
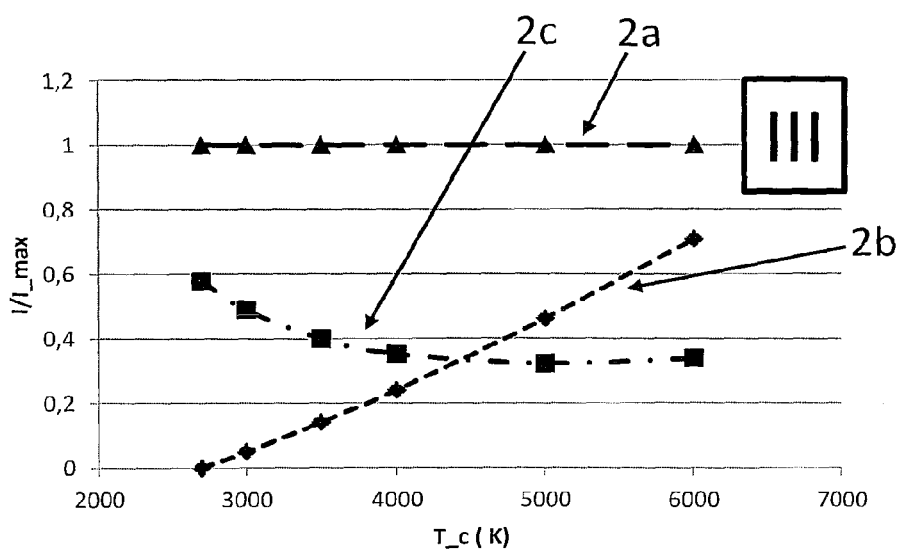

FIGS. 6A and 6B illustrate, analogously to FIG. 4A, the currents required for setting a respective color temperature $T_c$ in the case of variants "II" and "III". In principle, a higher proportion of blue light is required on account of the partial conversion; particularly at the color temperatures below 4000 K that are sufficient for a large number of applications, however, the currents are still considerably smaller than those of the green LED chips 2a. Therefore, the area proportion of the blue LED chips 2b should still be provided with significantly smaller dimensioning.

Figure 7A:
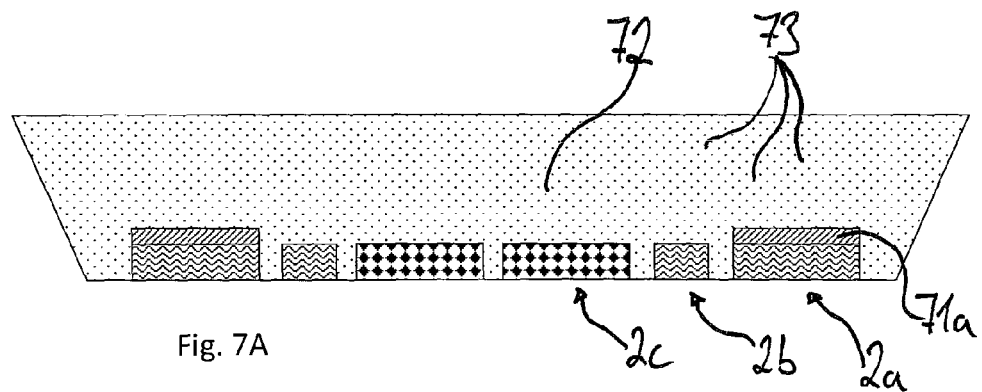
FIGS. 7A to 7C show schematic sectional illustrations of LED modules including a global phosphor element.
Figure 7B:
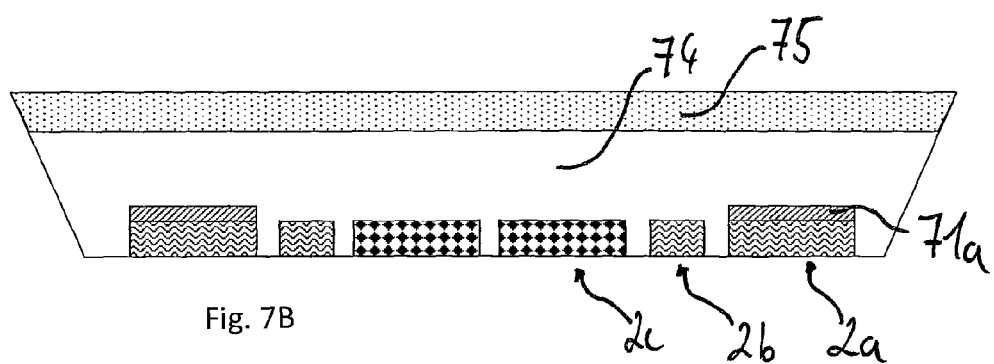
Figure 7C:
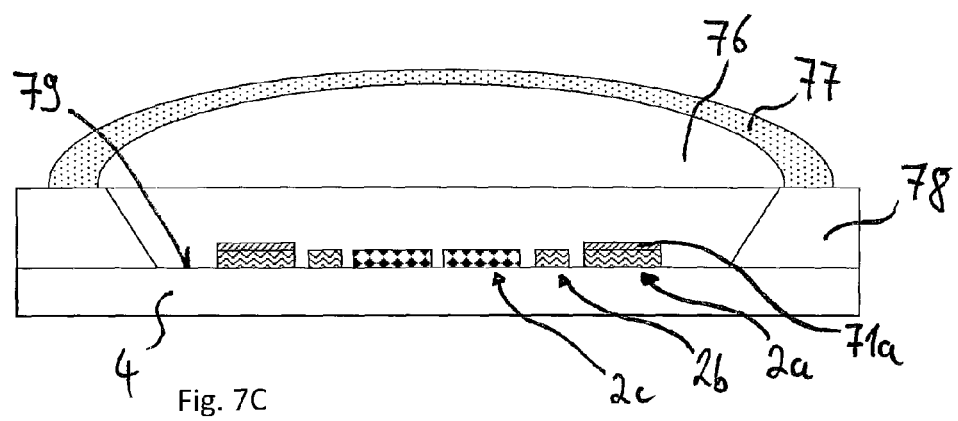
Figure 8:
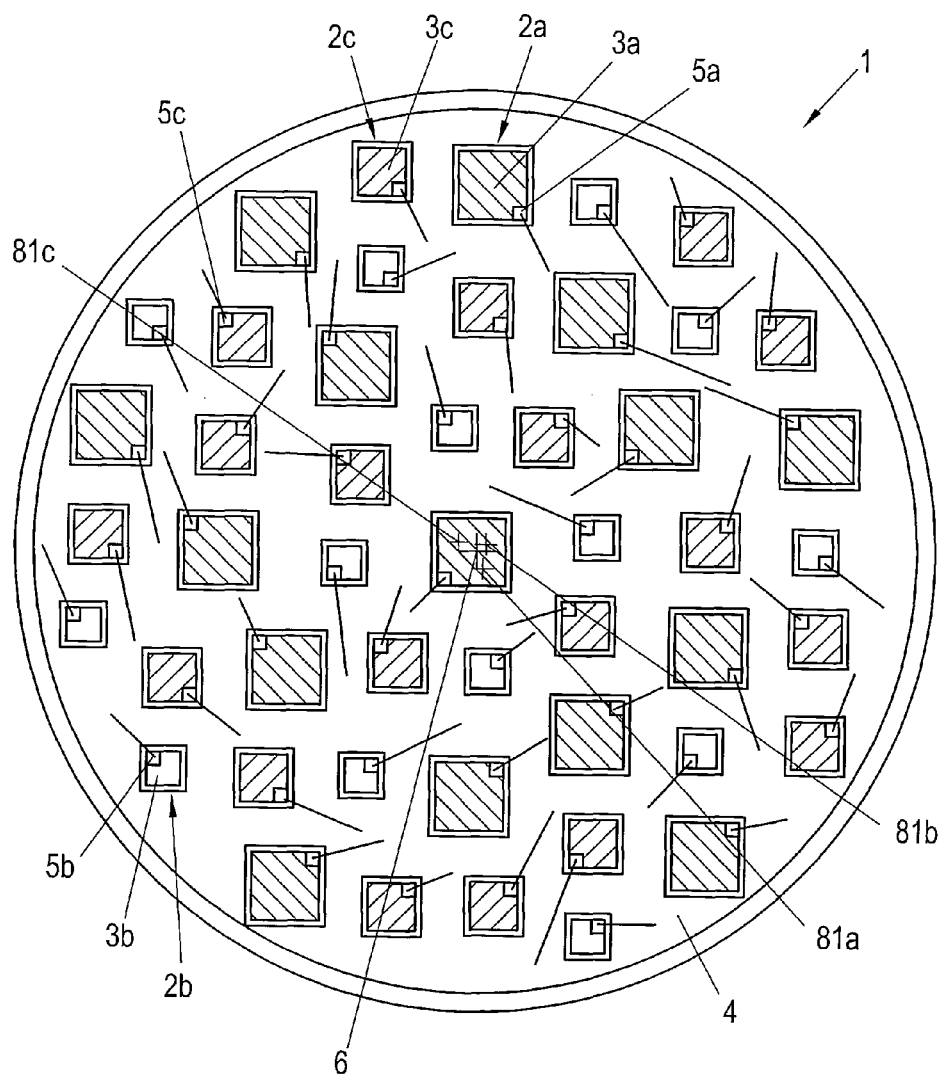
FIG. 8 shows an LED module according to the present disclosure including first, second and third LED chips gradated in terms of their size.

FIGS. 7A to 7c show various possibilities for providing the LED module 1 with a global phosphor element. The latter serves for the partial conversion of the light emitted by the small blue LED chips 2b, that is to say for achieving the bluish white hue. The phosphor element is provided globally, that is to say is not applied individually to the blue LED chips 2b because an individual coating of the blue LED chips 2b, which are small according to the present disclosure, would involve an excessively great outlay.

For this reason, unlike for the green LED chips 2a, a respectively dedicated phosphor layer 71a cannot be provided; in the case of the green LED chips 2a, this phosphor layer 71a provided in a chipwise manner converts the blue light emitted by the InGaN LED, and green light results.

For the bluish white color locus, a global phosphor element is arranged for converting the light provided by the blue LED chips 2b, that is to say that the light of the other LED chips 2a, 2c also radiates through said phosphor element.

In the case of the variant shown in FIG. 7A, the phosphor element is a matrix material 72, namely a silicone material, into which phosphor particles are embedded, to be precise either LuAGaG particles (variant "II") or nitridoorthosilicate particles (variant "III").

In the case of the embodiment in accordance with FIG. 7B, the LED chips 2a, b, c are likewise encapsulated with a silicone material 74, but no phosphor particles 73 are embedded into the latter. Instead, the global phosphor element as phosphor layer 75 is applied on the silicone material 74; the light of all the LED chips 2a, b, c again radiates through said phosphor element.

In the case of the variant in accordance with FIG. 7C, a phosphor element 77 spaced apart from the LED chips 2a, b, c by an air-filled intermediate region 76 is provided (remote phosphor). The LED chips 2a, b, c are embedded in silicone material 74 in this variant as well.

Furthermore, FIG. 7C also illustrates the carrier board 4 on which the LED chips 2a, b, c are mounted; a dam 78 extending circumferentially around the LED chips 2a, b, c is applied to the carrier board 4, which dam, during production, laterally delimits a cavity which is then filled with the silicone material 74. The surface 79 of the carrier board 4 is highly reflective and has a reflectivity of more than 90% in the visible spectral range; for this purpose, a silver mirror forms the surface 79, the LED chips 2a, b, c being arranged on said mirror.

In the illustration analogous to FIGS. 1 to 3, FIG. 8 shows an LED module 1 in plan view, fifteen first green LED chips 2a, fourteen second blue LED chips 2b and nineteen third red LED chips 2c having respective emission areas 3a, b, c being arranged on the arrangement area 4 of said LED module.

The LED chips are distributed on the arrangement area in such a way that the first, second and third emission area centroids 81a, b, c are almost congruent; when the emission area centroids 81a, b, c are respectively considered in pairs, the distance of a respective pair is less than 1% of the width of the LED module 1 taken along a connecting line connecting the pair, specifically of the width of that region of the arrangement area 4 which is populated with LED chips.

Furthermore, the respective mean distance between the first, second and third LED chips 2a, b, c and their respective first, second and third emission area centroids 81a, b, c is also almost of the same magnitude; from a total mean value of first, second and third mean distances, a respective mean distance deviates by not more than 5%.

The LED chips are supplied in parallel by a common driver. In the case of this driver concept, it is particularly advantageous if approximately the same voltage is dropped across each of the three strings—the first, second and third LED chips 2a, b, c are in each case combined in a manner connected in series to form a respective string.

For the first green LED chips 2a and the second blue LED chips 2b, InGaN LEDs are in each case provided (with individual phosphor coating in the case of the green LED chips 2a), for which reason the voltage dropped across each individual LED chip is approximately of the same magnitude and is approximately 3 volts. Ideally, an identical number of the green and blue LED chips 2a, b would therefore be provided. For the operation of the driver electronic unit just referred to, however, a supply voltage is required, for which reason an additional green LED chip 2a is provided; the voltage dropped across the latter serves for supplying the driver electronic unit. As red LED chips 2c, InGAlP LEDs are provided, across each of which a voltage of only approximately 2 volts is dropped. Accordingly, more red LED chips 2c have to be connected in series in order to bring the voltage dropped across this string close to the voltage respectively dropped across the other two strings. Therefore, in this example, 19 red LED chips 2c are provided, which results in a voltage of approximately 38 volts; in the case of an identical number relative to the blue LED chips 2b, however, a voltage of only 28 volts would result, which would be significantly less than that of the blue string (42 volts).

Therefore, provision is made of more red LED chips 2c than would be necessary—proceeding from the reference case with LED chips of the same size (relative to the green LED chips)—for generating the desired mixed light. In a manner according to the present disclosure, therefore, the respective emission areas 3c of the red LED chips 2c are reduced relative to the respective emission areas 3a of the green LED chips 2a. The respective emission areas 3c of the red LED chips 2c are of approximately double the size of the respective emission areas 3b of the blue LED chips 2b, and the respective emission areas 3a of the green LED chips 2a are in turn of double the size of the latter and thus approximately four times the size of the former. By providing the first, second and third LED chips 2a, b, c with a respectively adapted size of the emission area 3a, b, c and accordingly in a respectively adapted (in particular increased) number, it is therefore possible not only to improve the intermixing of the light but also to coordinate the respective strings with a driver electronic unit.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An LED module comprising
a number of first inherently unpackaged LED chips, wherein each of the first inherently unpackaged LED chips are designed to emit light of a first color at a respective light emission area,
and a number of second inherently unpackaged LED chips, wherein each of the second inherently unpackaged LED chips are designed to emit light of a second color, different than the first color, at a respective light emission area,
wherein the LED chips are provided jointly in a housing, and
the respective light emission area of a second individual LED chip is at least 25% smaller than the respective light emission area of a first individual LED chip,
wherein the sum of the light emission areas of the first LED chips is at least 50% greater than the sum of the light emission areas of the second LED chips.

2. The LED module as claimed in claim 1 comprising a number of third inherently unpackaged LED chips, which are provided jointly with the other LED chips in the housing and are designed to emit light of a third color, different than the first and second colors, at a respective light emission area, wherein the respective light emission area of a third LED chip, is larger than the respective light emission area of a second LED chip.

3. The LED module as claimed in claim 2, wherein the sum of the light emission areas of the third LED chips is at least 50% greater than the sum of the light emission areas of the second LED chips.

4. The LED module as claimed in claim 1, wherein the first color is a green hue, the second color is a blue hue and, in so far as a third color is provided, the third color is a red hue.

5. The LED module as claimed in claim 4, wherein the number of first LED chips is not more than three times greater than the number of second LED chips.

6. The LED module as claimed in claim 1, wherein second LED chips have a respective distance in each case with respect to a light emission area centroid formed as an area centroid of the emission areas of all the LED chips taking account of the distances between the emission areas, and said respective distances deviate by not more than 10% from a mean distance formed as a mean value of said respective distances.

7. The LED module as claimed in claim 6, wherein the second LED chips whose distances with respect to the light emission area centroid deviate by not more than 10% from a mean distance formed as a mean value of said respective distances are arranged substantially equidistantly with regard to a circumferential direction around the emission area centroid.

8. The LED module as claimed in claim 1, wherein at least one of a first light emission area centroid, formed as an area centroid of the emission areas of all first LED chips taking account of the distances between the respective emission areas thereof, and a second light emission area centroid, formed as an area centroid of the emission areas of all second LED chips taking account of the distances between the respective emission areas thereof, are substantially congruent, and the mean distance between the first LED chips and the first emission area centroid substantially corresponds to the mean distance between the second LED chips and the second emission area centroid.

9. The LED module as claimed in claim 1, wherein a phosphor element is provided downstream of all light emission areas of the LED chips, but said phosphor element serves primarily for the conversion of the light emitted by the second LED chips.

10. The LED module as claimed in claim 9, wherein the second LED chips emit light having a blue hue and the phosphor element comprises a green phosphor that partly converts the light having a blue hue.

11. The LED module as claimed in claim 10, wherein the second LED chips are InGaN LEDs and the green phosphor is one of a garnet phosphor and an orthosilicate phosphor.

12. The LED module as claimed in claim 9, wherein the phosphor element is a matrix material with phosphor particles embedded therein and said matrix material envelops all the LED chips of the LED module.

13. The LED module as claimed in claim 9, wherein all the LED chips of the LED module are enveloped with an enveloping body and the phosphor element is in layer form on the enveloping body.

14. The LED module as claimed in claim 9, wherein the phosphor element is provided in a manner spaced apart from the LED chips by an interspace filled with air.

15. The LED module as claimed in claim 9, wherein the phosphor element is provided in a manner spaced apart from an enveloping body that envelops all the LED chips of the LED module.

* * * * *